(12) United States Patent
Tam et al.

(10) Patent No.: US 6,788,156 B2
(45) Date of Patent: Sep. 7, 2004

(54) ADAPTIVE VARIABLE FREQUENCY CLOCK SYSTEM FOR HIGH PERFORMANCE LOW POWER MICROPROCESSORS

(75) Inventors: Simon M. Tam, Redwood City, CA (US); Stefan Rusu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/456,660

(22) Filed: Jun. 6, 2003

(65) Prior Publication Data

US 2003/0201838 A1 Oct. 30, 2003

Related U.S. Application Data

(63) Continuation of application No. 10/044,865, filed on Oct. 22, 2001, now Pat. No. 6,608,528.

(51) Int. Cl.[7] .......................... H03B 28/00; G06F 1/04; G06F 1/08; H03L 7/00; H03L 7/06
(52) U.S. Cl. .......................... 331/49; 331/2; 331/179; 713/501
(58) Field of Search .................... 331/1 A, 2, 10, 331/11, 17, 49, 74, 179; 713/500, 501

(56) References Cited

U.S. PATENT DOCUMENTS

| | | | |
|---|---|---|---|
| 5,021,679 A | 6/1991 | Fairbanks et al. | |
| 5,153,535 A | 10/1992 | Fairbanks et al. | |
| 5,307,003 A | 4/1994 | Fairbanks et al. | |
| 5,373,254 A | 12/1994 | Nakauchi et al. | |
| 5,392,437 A | 2/1995 | Matter et al. | |
| 5,495,617 A | 2/1996 | Yamada | |
| 5,557,551 A | 9/1996 | Craft | |
| 5,627,412 A | 5/1997 | Beard | |
| 5,719,800 A | 2/1998 | Mittal et al. | |
| 5,752,011 A | 5/1998 | Thomas et al. | |
| 5,766,228 A | 6/1998 | Bonnet et al. | |
| 5,815,693 A | * 9/1998 | McDermott et al. | ........ 713/501 |
| 5,815,724 A | 9/1998 | Mates | |
| 5,822,369 A | 10/1998 | Araki | |
| 5,964,881 A | 10/1999 | Thor | |
| 5,974,557 A | 10/1999 | Thomas et al. | |
| 6,029,006 A | 2/2000 | Alexander et al. | |
| 6,078,356 A | 6/2000 | Jensen | |
| 6,192,479 B1 | 2/2001 | Ko | |
| 6,211,740 B1 | * 4/2001 | Dai et al. | ........ 331/2 |
| 6,216,235 B1 | 4/2001 | Thomas et al. | |
| 6,219,796 B1 | 4/2001 | Bartley | |
| 6,219,797 B1 | * 4/2001 | Liu et al. | ........ 713/500 |
| 6,407,595 B1 | 6/2002 | Huang et al. | |
| 6,487,668 B2 | 11/2002 | Thomas et al. | |
| 6,559,631 B1 | 5/2003 | Balch et al. | |

FOREIGN PATENT DOCUMENTS

| | | |
|---|---|---|
| EP | 0592783 A2 | 4/1994 |
| EP | 0592783 B1 | 5/2001 |

OTHER PUBLICATIONS

U.S. patent application No. 10/206,610; filed Jul. 26, 2002, "A VCC Adaptive Dynamically Variable Frequency Clock System for High Performance, Low Power Microprocessors," 48 pages including Figures.

(List continued on next page.)

*Primary Examiner*—David Mis
(74) *Attorney, Agent, or Firm*—Ami Patel Shah (57) ABSTRACT

A method for dynamically varying a clock frequency in a processor. The method of one embodiment comprises driving a clock distribution network with a clock output from a phased locked loop (PLL). An adjustable clock generator is locked with the phased locked loop. The adjustable clock generator is substituted for the PLL on the clock distribution network.

10 Claims, 5 Drawing Sheets

OTHER PUBLICATIONS

U.S. patent application No. 09/471,795; filed Dec. 23, 1999, "Microprocessor with Digital Power Throttle," 31 pages including Figures.

U.S. patent application No. 10/041,092; filed Dec. 28, 2001, "Digital Throttle for Multiple Operating Points," 30 pages including Figures.

U.S. patent application No. 10/227,125; filed Aug. 23, 2002, "An Apparatus for Thermal Management of Multiple Core Microprocessors," 21 pages including Figures.

U.S. patent application No. 10/041,013; filed Dec. 28, 2001, "Multiple Mode Power Throttle Mechanism," 32 pages including Figures.

* cited by examiner

ADAPTIVE VARIABLE FREQUENCY CLOCK SYSTEM FOR HIGH PERFORMANCE LOW POWER MICROPROCESSORS

This patent application is a Continuation of U.S. patent application Ser. No. 10/044,865, entitled "An Adaptive Variable Frequency Clock System For High Performance Low Microprocessors", filed Oct. 22, 2001, now U.S. Pat. No. 6,608,528.

FIELD OF THE INVENTION

The present invention relates generally to the field of microprocessors and computer systems. More particularly, the present invention relates to a method and apparatus for an adaptive variable frequency clock system for microprocessors.

BACKGROUND OF THE INVENTION

In recent years, the price of personal computers (PCs) have rapidly declined. As a result, more and more consumers have been able to take advantage of newer and faster machines. Computer systems have become increasingly pervasive in our society. But as the speed of the new processors increases, so does the power consumption. Furthermore, high power consumption can also lead to thermal issues as the heat has to be dissipated from the computer system.

One attempt to reduce power consumption entails the use of low power circuit devices. Another power saving method is to use software in controlling system power and shutting down system devices that are not needed. Several voltage/frequency adjustment schemes including Intel® SpeedStep™ technology have been developed to maximize battery life for mobile processors.

But even as designers slowly reduce the power needs of the overall system, the power requirements of the processor have often remained steady. Furthermore, existing schemes are usually targeted at mobile products. Present methods that implement deep processor operating frequency reductions do so by adjusting the bus ratios. Such methods are not feasible in a server or desktop product because of the significant performance impact.

A high clock frequency is one of the principal performance drivers for a high performance microprocessor design. Thus one common method for achieving higher performance is to increase the processor operating frequency. Frequency gains can be attained through techniques such as technology scaling, advanced pipelining and circuit optimizations. As a result, processors with operating frequencies approaching or exceeding 2 gigahertz (GHz) are on the near horizon. But one significant drawback of this current trend is the increase in power dissipation. As the performance trend continues, thermal and power delivery constraints will become a significant hurdle in the development of future high performance multi-GHz processors. Power is linearly proportional to the operating frequency (i.e. Power $\propto$ Frequency$\cdot$Voltage$^2$). Thus power dissipation can be lowered by decreasing the operating frequency at selected times.

Figure 1:
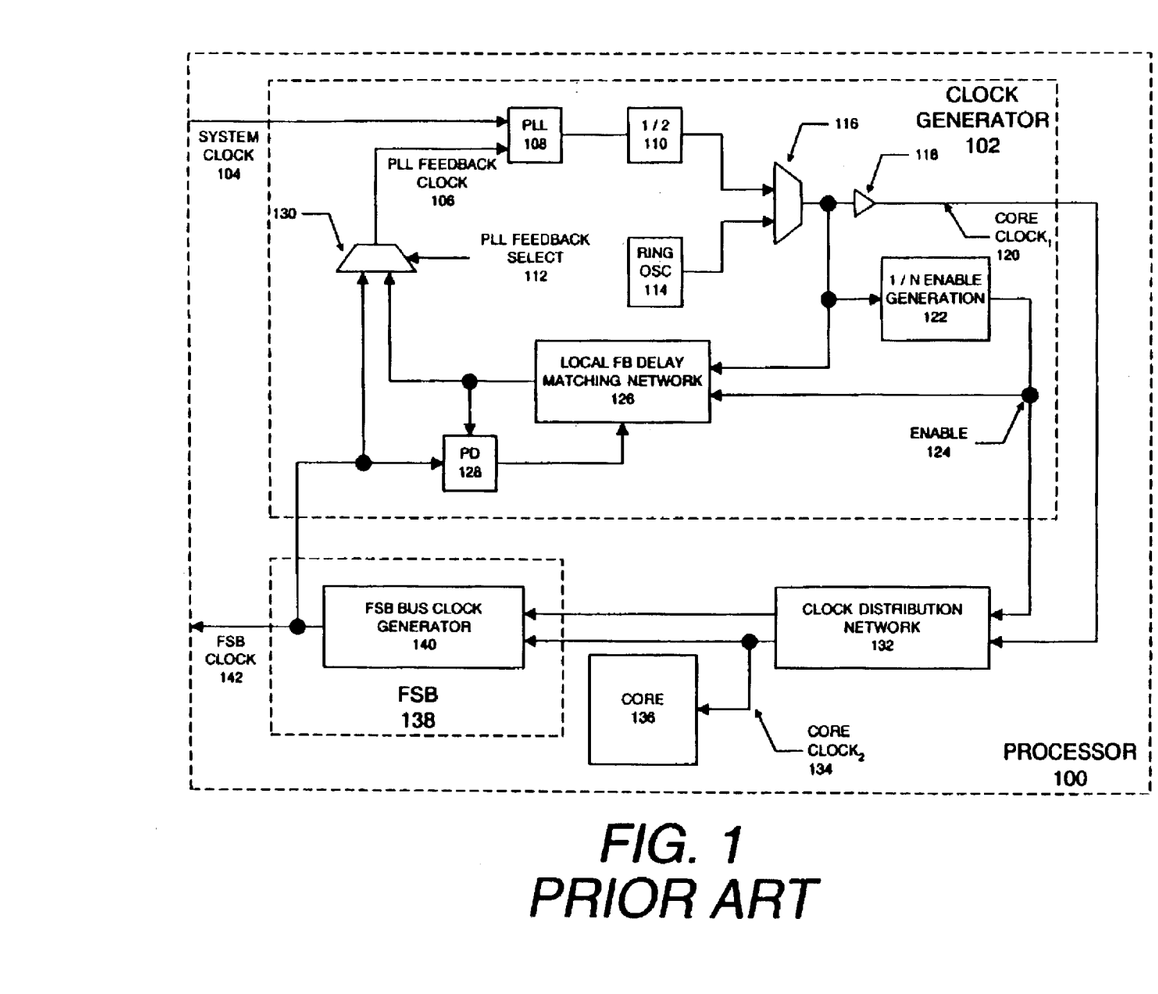
FIG. 1 is block diagram of a typical prior art microprocessor clock generator circuit architecture.

FIG. 1 is block diagram of a typical prior art microprocessor clock generator circuit architecture. The processor 100 includes a clock generator 102 and a front side bus (FSB) unit 138. Clock generator 102 provides an internal processor clock to the processor core 136 and to the FSB unit 138. The clock generator 102 comprises a phase locked loop (PLL) 108, ring oscillator 114, and a feedback network. The on-chip PLL 108 multiplies the frequency of the system clock 104 to generate the on-chip core clock (Core Clock$_1$) 120. The core to system clock frequency multiplication factor is determined by the bus fraction ratio N, where N>1 and typically between 10 and 30. The bus fraction ratio N is normally set to a constant for most microprocessor systems.

Frequency/voltage adjustment methods can be used to control power consumption. However, modifications to the core clock signal during processor operation can cause errors to the system. Typically, existing frequency adjustment schemes need to stop or pause the processor core before adjusting the clock frequency or modifying the bus ratio. Frequencies are changed in a clocked device by placing the device in an idle state, changing the core clock frequency to the new frequency, and locking the PLL in phase with the new frequency. The length of the idle state required for the changing and locking to occur slows down the system. Such a pause can have a significant impact on the overall performance of a desktop or server.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for an adaptive variable frequency clock system is disclosed. The embodiments described herein are described in the context of a microprocessor, but are not so limited. Although the following embodiments are described with reference to a processor, other embodiments are applicable to other integrated circuits or logic devices. The same techniques and teachings of the present invention can easily be applied to other types of circuits or semiconductor devices that can benefit from power savings.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular detail in order to not necessarily obscure the present invention.

Many present day microprocessors consume significant amounts of power during normal operations. This power consumption has also led to issues in power dissipation. Processors and systems are generally designed to operate within set thermal envelopes. As the performance and power requirements increase, this envelope can often be pushed to the limit or even exceeded. Power dissipation has been determined to be proportional to the product of the operating frequency and the power supply voltage squared. One disadvantage of existing clock architectures such as the circuit in FIG. 1 is that the core operating frequency is fixed. The core frequency of a typical processor is determined by the bus fraction ratio N.

A number of different schemes have been developed to address this issue in the mobile arena. However, these same schemes cannot be applied to desktop and server environments due to system and performance requirements. For instance, several voltage/frequency adjustments schemes developed to maximize batter life for mobile processors implement deep reductions in the processor operating frequency by adjusting the bus ratio. One example of a scheme to adjust the operating frequency and the power supply voltage to optimize the power dissipation is Intel SpeedStep technology. However, these schemes require the processor to enter into an idle state in order to change the clock frequency. Furthermore, adjusting the bus ratio leads to large frequency steps. Deep frequency reductions are not feasible in server products because large frequency reductions would have significant performance impacts. Even though these schemes can also adjust the supply voltage, the adjustments are made at relatively large steps.

A recent technique for lowering the power dissipation of a processor involves dynamically adjusting the core frequency and/or the power supply voltage. By dynamically adjusting the frequency and voltage, the operating point of the processor can be shifted from a high performance state to a lower performance state and vice versa, while the processor continues to operate normally. The clock frequency is adjusted at smaller increments and result in a transparent change relative to the processor core. Thus the operation of the processor can managed such that the necessary performance level is achieved while keeping the processor within the allowable thermal and power specifications. Designers may find it highly desirable to have a clocking architecture that can support dynamic frequency/voltage transitions without a latency penalty or performance loss.

The present invention can provide a frequency adjustment technique that is optimal for low-cost and high volume servers. Embodiments of the present invention when implemented in conjunction with a matching voltage control mechanism can extend power management capabilities that are presently available to mobile systems to desktop and multiprocessor server systems. One embodiment of the clock control technique described below implements smaller frequency steps at the higher end of the processor operating frequency range. These smaller steps are useful for minimizing performance impact on the server while the operating point is shifted. The use of small frequency steps can also avoid the need for PLL relock time.

Figure 2:
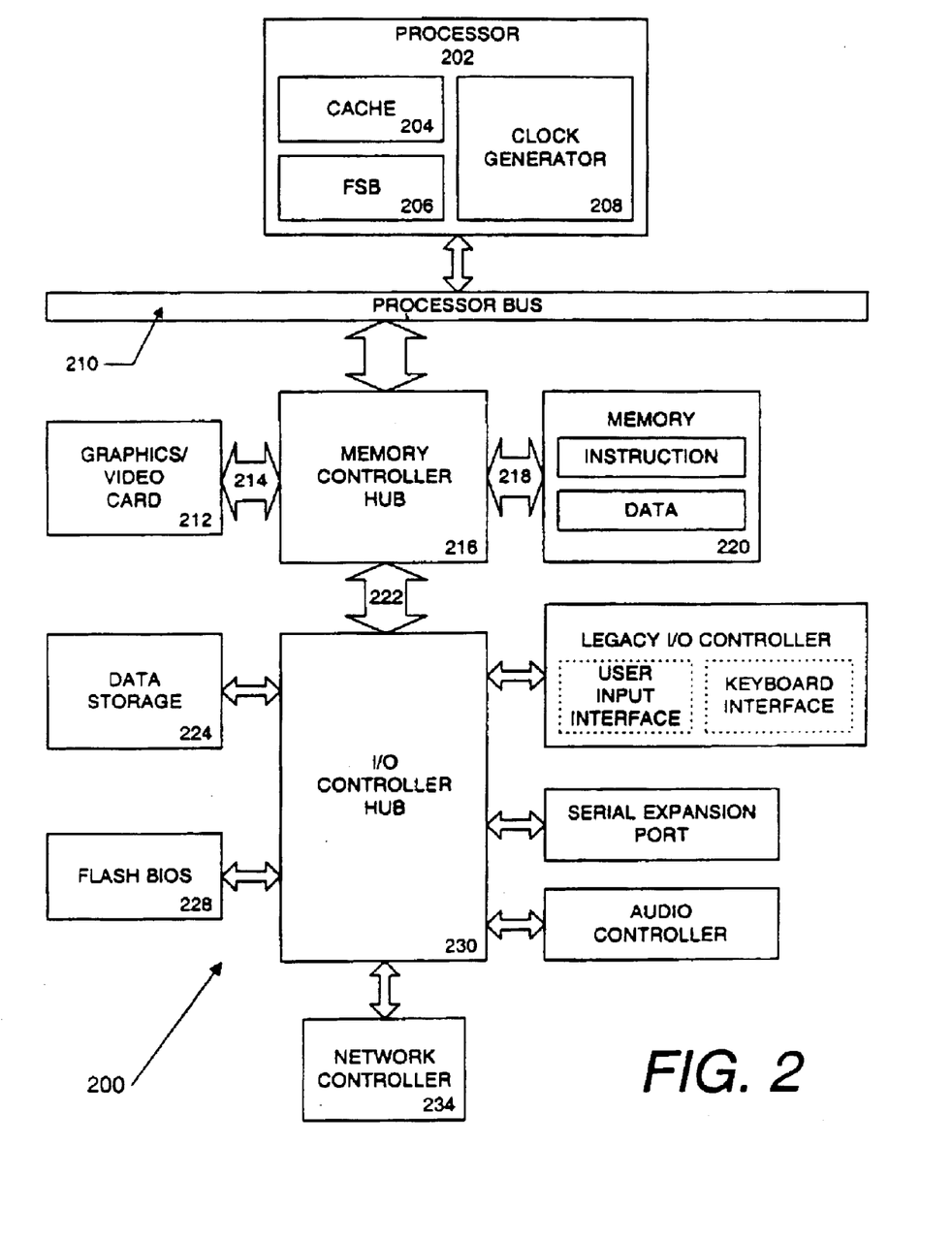
FIG. 2 is a block diagram of a computer system formed with a processor that includes an adaptive variable frequency clock system in accordance with the present invention.

Referring now to FIG. 2, an exemplary computer system 200 is shown. System 200 includes a component, such as a processor, employing an adaptive variable frequency clock system in accordance with the present invention, such as in the embodiment described herein. System 200 is representative of processing systems based on the PENTIUM® III, PENTIUM® 4, Itanium™ microprocessors available from Intel Corporation of Santa Clara, Calif., although other systems (including PCs having other microprocessors, engineering workstations, set-top boxes and the like) may also be used. In one embodiment, sample system 200 may be executing a version of the WINDOWS™ operating system available from Microsoft Corporation of Redmond, Wash., although other operating systems and graphical user interfaces, for example, may also be used. Thus, the present invention is not limited to any specific combination of hardware circuitry and software.

The present enhancement is not limited to computer systems. Alternative embodiments of the present invention can be used in other devices such as, for example, handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which use a mechanism for minimizing power dissipation for other embodiments.

FIG. 2 is a block diagram of a computer system 100 formed with a processor 202 that includes an adaptive variable frequency clock system in accordance with the present invention. The present embodiment is described in the context of a single processor desktop or server system, but alternative embodiments can included in a multiprocessor system. System 200 is an example of a hub architecture. The computer system 200 includes a processor 202 that processes data signals. The processor 202 can be a complex instruction set computer (CISC) microprocessor, a reduced instruction set computing (RISC) microprocessor, a very long instruction word (VLIW) microprocessor, a processor implementing a combination of instruction sets, or other processor device, such as a digital signal processor, for example. FIG. 2 shows an example of an embodiment of the present invention implemented in a multiprocessor system 200. However, it is understood that other embodiments may alternatively be implemented as systems having a single processor. The processor 202 is coupled to a processor bus 210 that transmits data signals between the processor 202 and other components in the system 200. The elements of system 200 perform their conventional functions well known in the art.

In one embodiment, the processor 202 includes an internal cache memory 204. Depending on the architecture, the processor 202 can have a single internal cache or multiple levels of internal caches such as a Level 1 (L1) and a Level 2 (L2) cache. A front side bus (FSB) unit 206 and a clock generator 208 also resides in the processor 202. The FSB unit 206 is coupled to the bus interface between the processor 202 and the processor bus 210. The FSB unit 206 manages the bus transactions in and out of the processor 202. Alternate embodiments of an adaptive variable clock system 208 can also be used in microcontrollers, embedded processors, graphics devices, DSPs, and other types of logic circuits.

For the embodiment of a processor system 200 in FIG. 2, the processor 202 has the capability to control its own voltage and frequency operating points through an on-chip controller. A frequency/voltage adjusting mechanism including an adaptive variable frequency clock system of the present invention can allow a processor to operate at a variety of frequencies.

System 200 includes a memory 220. Memory 220 can be a dynamic random access memory (DRAM) device, a static random access memory (SRAM) device, flash memory device, or other memory device. Memory 220 can store instructions and/or data represented by data signals that can be executed by the processors 202. A cache memory 204 can reside inside the processor 202 that stores data signals stored in memory 220. Alternatively, in another embodiment, the cache memory can reside external to the processor 202.

A system logic chip 216 is coupled to the processor bus 210 and memory 220. The system logic chip 216 in the illustrated embodiment is a memory controller hub (MCH). The processor 202 communicates to the MCH 216 via a processor bus 210. The MCH 216 provides a high bandwidth memory path 218 to memory 220 for instruction and data storage and for storage of graphics commands, data and textures. The MCH 216 directs data signals between the processor 202, memory 220, and other components in the system 200 and bridges the data signals between processor bus 210, memory 220, and system I/O 222. In some embodiments, the system logic chip 216 provides a graphics port for coupling to a graphics controller 212. The MCH 216 is coupled to memory 220 through a memory interface 218. The graphics card 212 is coupled to the MCH 216 through an Accelerated Graphics Port (AGP) interconnect 214.

System 200 uses a proprietary hub interface bus 222 to couple the MCH 216 to the I/O controller hub (ICH) 230. The ICH 230 provides direct connections to some I/O devices. Some examples are the audio controller, firmware hub (flash BIOS) 228, data storage 224, legacy I/O controller containing user input and keyboard interfaces, a serial expansion port such as Universal Serial Bus (USB), and a network controller 234. The data storage device 224 can comprise a hard disk drive, a floppy disk drive, a CD-ROM device, a flash memory device, or other mass storage device. System 200 also includes a power supply that can both source and sink current to the above mentioned components.

For another embodiment of a system, one implementation of an adaptive variable clock mechanism can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip. By including one embodiment of the present invention on the system on a chip, the frequency/voltage controller can adjust the processor frequency and voltage to minimize power dissipation.

Figure 3:
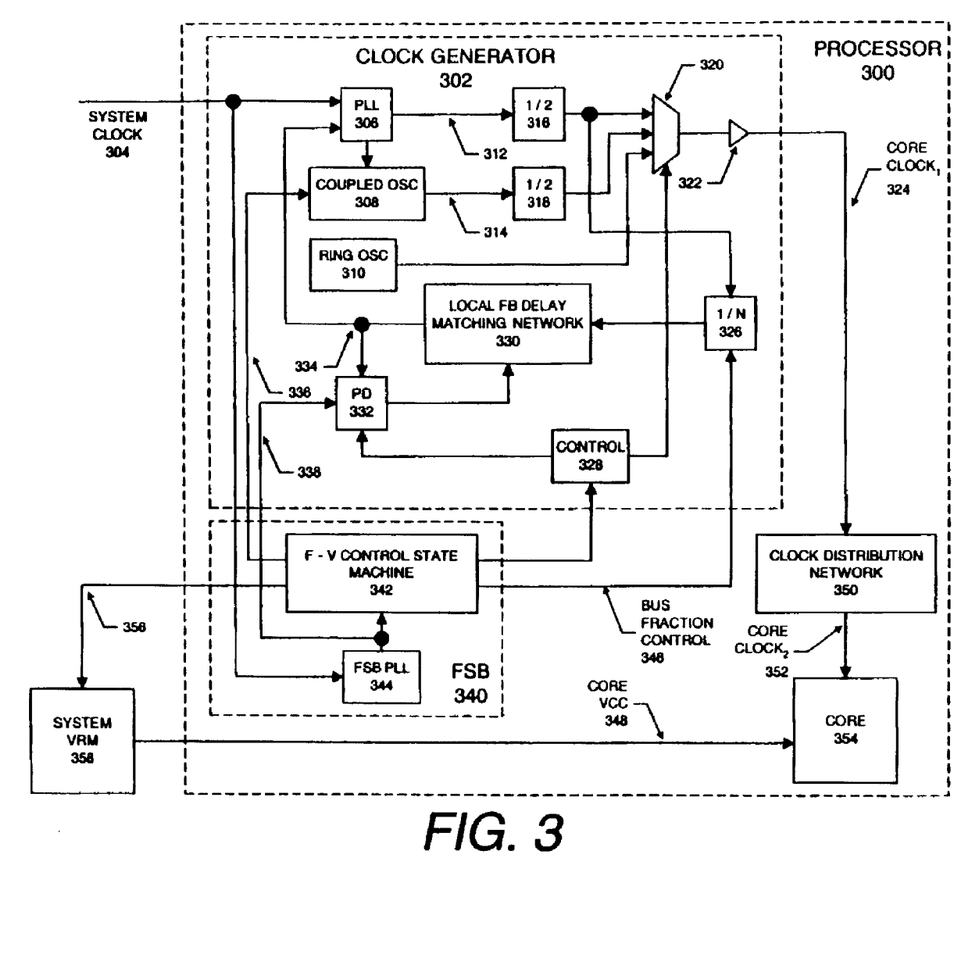
FIG. 3 is a block diagram of a microprocessor clock generator circuit architecture having an adaptive variable frequency clock system in accordance with the present invention.

FIG. 3 is a block diagram of a processor 300 that includes a mechanism for adjusting the voltage and frequency in accordance with the present invention. The processor 300 contains a clock generator 302 and a front side bus (FSB) unit 340. The clock generator 302 is an adaptive variable frequency clock system capable of varying the frequency of its clock output without suspending processor operation or relocking. Clock generator 302 provides an internal processor clock signal CORE CLOCK$_1$ 324 to the processor core 354 via a clock distribution network 350. The FSB unit 340 contains a FSB PLL 344 and generates its own FSB clock signal 338.

The clock generator 302 comprises a phase locked loop (PLL) clock generator 306, coupled oscillator clock generator 308, a ring oscillator 310, and a local feedback delay matching network 330. The ring oscillator 310 provides the processor 300 with a clock signal some frequency. The frequency is not well controlled and may not be constant. The ring oscillator 310 is used to clear contention problems during the very early power up stage when the supply voltage is still ramping. The on-chip PLL 306 multiplies the frequency of the system clock 304 to generate the on-chip core clock (Core Clock$_1$) 324. The configuration of the PLL 306 in the clock generator 302 enables the microprocessor core frequency to be significantly higher, N times greater in this case, than the system frequency. By using an on-chip PLL 306 for core clock synthesis, the core clock distribution delay can be hidden from the system. This allows for high performance FSB input-output (I/O) transactions. The coupled oscillator circuit 308 is capable of providing a clock signal of varying frequencies. The outputs 312, 314 from the PLL 306 and coupled oscillator 308, respectively, pass through frequency dividers 316, 318 that multiply the frequency of the signal by "½" prior to the multiplexor 320 in order to attain a 50% duty cycle core clock. Other values may be used in place of "½". In some implementations, the division by "2" is skipped. Multiplication by "½" or "1" is typical. The multiplexor 320 receives the output signals from the PLL 306, coupled oscillator 308, and the ring oscillator 310 and outputs one of the signals depending on the select from control circuit 328. The multiplexor output passes through a buffer 322 to the clock distribution network 350 before reaching the core 354.

For this embodiment, the PLL circuit 306 provides the initial clock signal for the processor core 354 during system startup. When the processor reaches a stable operating point, the clock output of the coupled oscillator 308 can be switched over as the output of the multiplexor 320 and becomes CORE CLOCK$_1$ 324 instead of the PLL clock signal 312. The clock signal from the PLL 306 is also coupled to a local feedback delay matching network 330 through a "1/N" frequency divider 326. The local feedback delay matching network imitates of the clock distribution network. The output of the delay network 330 is coupled back to the PLL 306. Thus the PLL output 312 is fed back to the PLL circuit to ensure that the PLL clock signal is still in phase and in sync with the system clock 304.

The FSB PLL 344 also receives the system clock 304 and is locked to the signal. The FSB PLL output signal 338 is coupled to a frequency/voltage control state machine (F-V CSM) 342 and a phase detector 332. For this embodiment, the F-V CSM 342 resides with the bus logic 340 and receives inputs from the system and other on-chip sources. For example, the F-V CSM 342 can adjust the clock frequency and supply voltage based on what instruction set is being executed or an internal temperature sensor output. The F-V CSM 342 includes logic for adjusting the processor internal frequency and the supply voltage levels in order to shift the processor operating point. The F-V CSM 342 can control whether the processor 300 operates at a maximum frequency/voltage point or at a lower performance point depending on the system requirements and other conditions such as thermal or power restrictions. The frequency and voltage values have to be adjusted together in order to prevent glitches and errors in the processor 300.

The system voltage regulator module (VRM) 358 receives a control signal 356 from the F-V CSM 342 that controls the voltage output of the VRM 358. The VRM 358 supplies a VCC supply voltage 348 to the processor core 354. The F-V CSM also provides control signals to the clock generator control 328 and the "1/N" frequency divider 326 to control the frequency of the clock generator output 324. The coupled oscillator 308 also receives control signals 336 from the F-V CSM 342 that indicates what frequency the coupled oscillator 308 outputs as the coupled oscillator is capable of operating at a variety of frequencies depending on the setting.

One issue that has been present in existing frequency/voltage adjustment schemes is the required latency between each operating point adjustment. This latency can be on the order of tens of microseconds. Furthermore, the adjustments do not take effect transparently and the processor has been required to enter a idle or sleep mode during each frequency/voltage transition. Therefore, existing frequency/voltage transition schemes have been less than useful in high performance server systems where peak performance is expected at all times.

Embodiments of the present invention can allow for the dynamic adjustment of the core frequency and the core supply voltage in order to reduce power dissipation. The clock generation system of the present embodiment uses small frequency steps in making frequency adjustments at the coupled oscillator 308. The smaller frequency steps eliminates the need for a latency period during an adjustment wherein the coupled clock generator 308 relocks with the system clock. Thus the performance loss that can result from a frequency/voltage transition can be minimized. For one embodiment, the frequency change can take effect within a few core clock cycles versus the tens of thousands of core clock cycles that were needed in prior schemes. The architecture of this implementation enables smaller frequency steps in the range of between $f_{MAX}$ and about 0.75 $f_{MAX}$, where $f_{MAX}$ is the highest operating frequency of the microprocessor.

The adaptive variable frequency clock system of this embodiment as shown in FIG. 3 comprises of a coupled oscillator clock generator 308, a local clock generator feedback loop that maintains the core PLL in lock, a F-V CSM 342 that determines the desired frequency steps and the core voltage values, clock generator control logic 328 to select the clock signal to be used in the core 354, and a FSB PLL 344 to supply a constant FSB clock signal 338 that is synchronized to the system clock 304.

Figure 4:
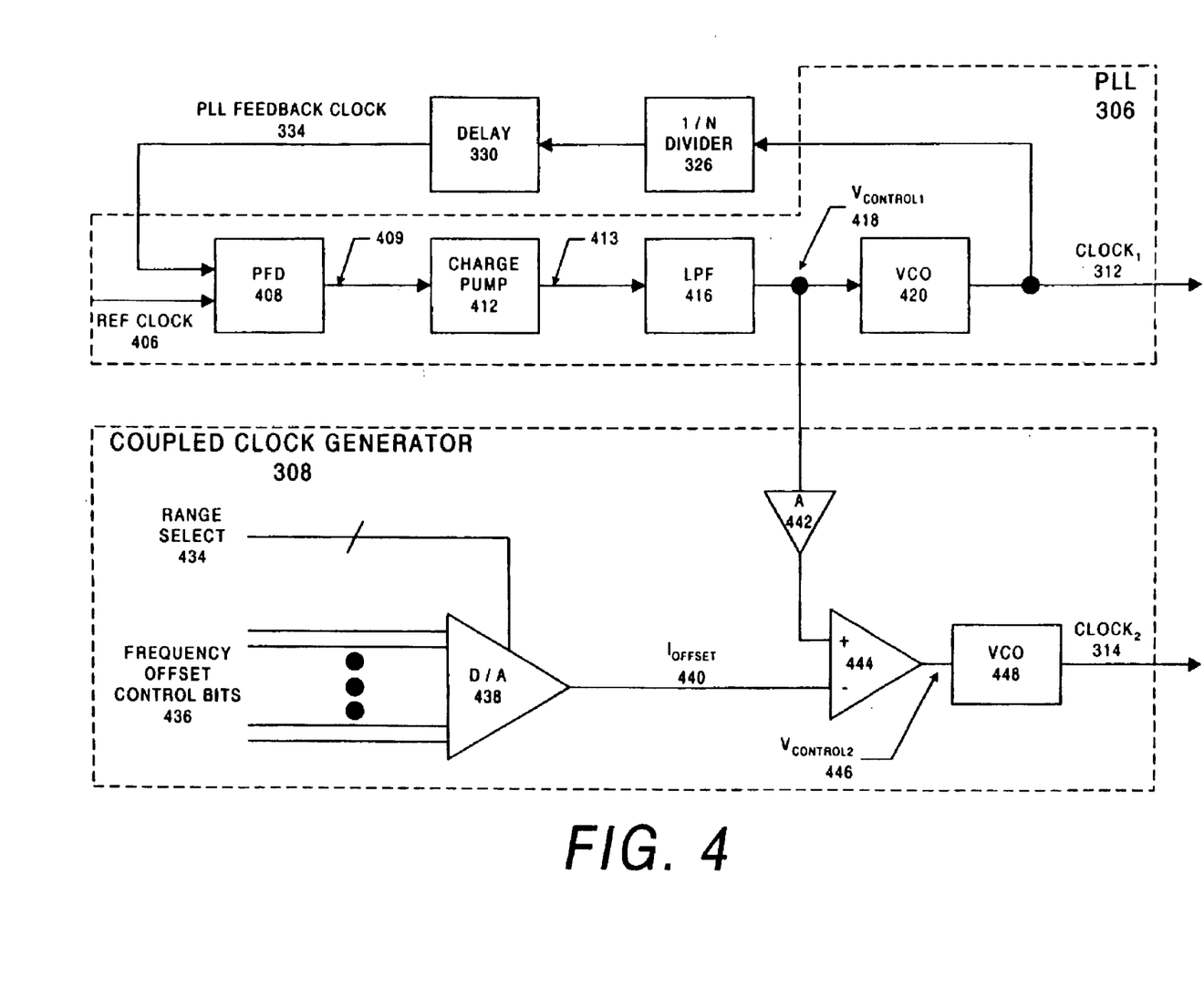
FIG. 4 is a block diagram of an adaptive frequency clock generator of one embodiment.

FIG. 4 is a block diagram of an adaptive frequency clock generator of one embodiment. FIG. 4 illustrates in more detail the PLL and the coupled clock generator architecture. The PLL 402 of this embodiment contains phase frequency detector (PFD) 408, charge pump 412, low pass filter (LPF) 416, and voltage controlled oscillator (VCO) 420. A local feedback delay matching network 330 provides delay to the PLL feedback loop after a "1/N" frequency divider 326. PLL 402 receives a reference clock signal 406 from outside. In this example, the reference clock 406 is the system clock signal 304 as shown in FIG. 3. PFD 408 compares the arrival times and phases of the reference clock signal 406 and the PLL feedback clock signal 334 to detect a difference between the two signals. PFD 408 outputs a control signal 409 to charge pump 412 based on this difference. Control signal 409 may instruct charge pump 412 to output more, less, or the same amount of voltage. Charge pump 412 then outputs an appropriate amount of voltage 413. LPF 416 filters the signal 413 and outputs $V_{CONTROL1}$ 418. VCO 420 generates PLL clock signal $CLOCK_1$ 312 based on the value of $V_{CONTROL1}$ 418. An increase in the voltage of $V_{CONTROL1}$ 418 causes VCO 420 to increase the frequency of $CLOCK_1$ 312, while a decrease in voltage causes VCO 420 to decrease the frequency of $CLOCK_1$ 312. Frequency divider 326 multiplies the frequency of $CLOCK_1$ 312 by "1/N" prior to delay 330. The delayed clock signal, PLL feedback clock 334, is connected to PFD 408 to complete the local clock generator feedback loop. The PLL 306 is locked in phase with the reference clock signal 406. In this embodiment, the core PLL 306 has its own feedback loop and is not disturbed. The PLL 306 can continue to operate in a locked fashion generating a stable $V_{CONTROL1}$ voltage 418 even though the frequency of the core clock signal 324 is being adjusted.

The coupled clock generator (oscillator) 308 of this embodiment contains a VCO 448, a digital-to-analog (D/A) converter 438, and a current-to-voltage summing amplifier 444. Current-to-voltage summing amplifier 444 converts its current inputs into a voltage output. The D/A converter 438 is a multiplying precision D/A converter that provides a frequency adjustment range and offset to the VCO 448. D/A converter 438 receives a number of control signals, frequency offset control bits 436 and a range select 434, from the F-V CSM logic 342. Range select 434 determines the magnitude of the output current or a current scaling setting for the multiplying D/A converter 438, wherein $I_{OFFSET}$= frequency control setting 436*range control setting 434. The F-V CSM 342 controls the clock frequency adjustments and causes the coupled oscillator 308 to output the appropriate clock signal $CLOCK_2$ 314. Based on the settings of the select 434 and control bits 436, D/A converter 438 outputs a $I_{OFFSET}$ 440 value to summing amplifier 444. The coupled oscillator 308 is coupled to PLL 306 and receives $V_{CONTROL1}$ 418 through a voltage/current (V/I) amplifier 442. Summing amplifier 444 evaluates the differences in the input values and outputs a $V_{CONTROL2}$ 446 signal to VCO 448. Thus the control voltage $V_{CONTROL2}$ 446 to the VCO 448 of the coupled clock generator 308 is dependent on the control voltage $V_{CONTROL1}$ 418 of the core PLL 306. VCO 448 generates coupled oscillator clock signal $CLOCK_2$ 314 based on the value of $V_{CONTROL2}$ 446.

The coupled clock generator 432 of this embodiment uses a VCO 448 that has its control voltage $V_{CONTROL2}$ 446 referenced to the core PLL VCO control voltage $V_{CONTROL1}$ 418. Control voltage $V_{CONTROL2}$ 446 is the difference of $V_{CONTROL1}$ 418 and a voltage offset that is derived from the F-V CSM 342. $V_{CONRTROL2}=V_{CONTROL1}-V_{FREQ-OFFSET}$, where $V_{FREQ-OFFSET}$ is based on the frequency offset control bits 436 via $I_{OFFSET}$ 440 and the D/A converter 438.

At initial processor startup, the core PLL output $CLOCK_1$ 312 is selected. The clock system 302 goes through a normal startup process wherein the core PLL 306 locks to the external system clock 304. The control voltage $V_{control1}$ 418 of core PLL VCO 420 will reach a stable value reflecting a stable operating frequency consistent with the system clock frequency and the bus fraction ratio. Because the VCO 448 of the coupled clock generator 308 is referenced to the control voltage 418 of core PLL VCO 420, the coupled clock generator VCO 448 will oscillate at the same frequency as the core PLL 306.

After the stabilization of the core PLL 306, the F-V CSM 342 selects the coupled oscillator output $CLOCK_2$ 314 as the clock for the processor core 354. For this embodiment, the initial frequency offset of $CLOCK_2$ 314 from $CLOCK_1$ 312 is zero. Thus the core 354 will continue to operate at the same initial frequency when the core clock 324 is switched from $CLOCK_1$ 312 to $CLOCK_2$ 314. Subsequently, the F-V CSM 342 can adjust the processor supply voltage and the processor clock frequency to shift the processor operating point to meet certain power reduction criteria. The operating frequency can be adjusted by toggling the frequency offset bit settings 436 to a non-zero value. The frequency offset range select setting 434 permits an optimization of the frequency offset range to achieve the desired power and performance trade off.

The frequency offset range can be predetermined in some embodiments for a certain class of microprocessors via on-chip fuses or preprogrammed settings. Thus the frequency adjustments can scale with designs having different $f_{MAX}$ values. For this embodiment, the targeted frequency range is from $f_{MAX}$ having zero offset to about 0.75 $f_{MAX}$ having an offset of 0.25 $f_{MAX}$, where $f_{MAX}$ is the highest frequency of the processor. The number of frequency offset steps targeted in one embodiment is in the range of four to sixteen.

Figure 5:
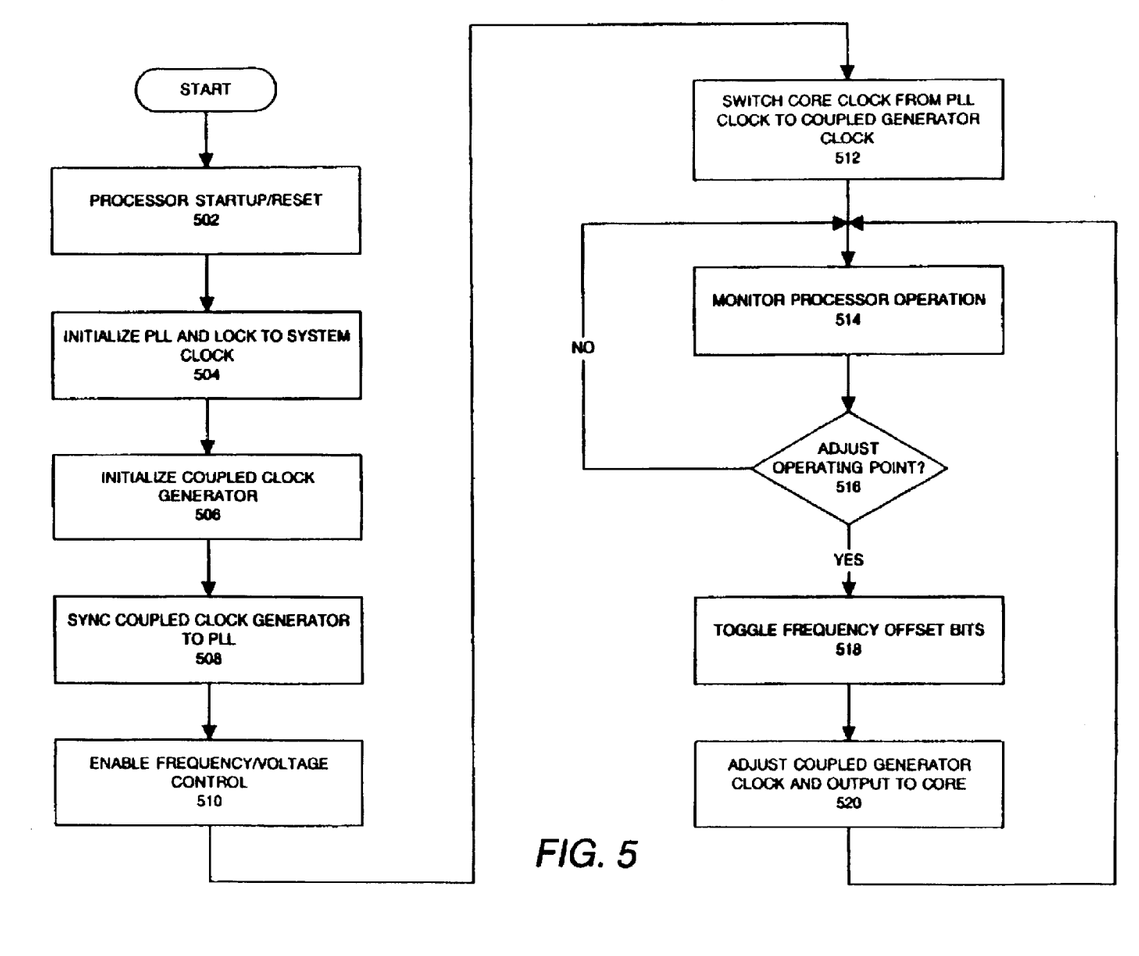
FIG. 5 is a flow chart showing one embodiment of a method in accordance with the present invention for varying clock frequencies in a microprocessor.

FIG. 5 is a flow chart showing one embodiment of a method in accordance with the present invention for varying clock frequencies in a microprocessor. This example generally describes the operation of a dynamically variable frequency clock generator mechanism of one embodiment when adjusting the processor voltage and frequency to minimize power dissipation.

At step 502, the processor 300 is initialized upon startup or reset. The clock system 302 is started up. At step 504, the PLL clock generator 306 is initialized and locked to the system clock 304. The processor core 354 is supplied with the clock signal from the PLL 306. The coupled clock generator 308 of this embodiment is initialized at step 506. However, this coupled clock generator initialization step may not be needed in alternative embodiments. For example, in another embodiment, the offset setting of the coupled clock generator 308 is zero. The coupled clock generator 308 will start up in the same fashion as the VCO 420 in the PLL 306, but the CLOCK$_2$ output signal 314 of the coupled clock generator 308 is not yet used. If the initial offset of the coupled clock generator 308 is zero, the frequency of the coupled clock generator 308 will follow the frequency of the PLL VCO 420. The PLL 306 and coupled clock generator 308 are synced together via control signals to their VCOs 420, 448 at step 508. Because of the clock signal synchronization, the coupled oscillator clock signal 314 can be transparently substituted for the PLL clock signal 312. The frequency/voltage control logic 342 is enabled at step 510. The frequency/voltage control 342 can shift the processor operating point by adjusting the processor core frequency and the processor supply voltage.

As the frequency/voltage control logic 342 takes control, the core clock is switched at step 512 from the PLL clock 312 to being supplied with the coupled clock generator clock signal 314. At step 514, the processor operation is monitored. The frequency/voltage control logic 342 analyzes input from sensors that can track current, power, temperature, or processing load. The sensor values are evaluated to determine how much power the processor 300 is consuming.

Based on what the processor power consumption is, the controller 342 can find an appropriate operating point for the processor 300. At step 516, the mechanism 342 decides whether the operating point of the processor 300 should be adjusted. The controller of one embodiment compares the power consumption value with a table of values stored in memory to determine at what the frequency and voltage should be set. If the frequency and voltage values are the same or approximate to the present values or otherwise within acceptable limits, the processor operating point is not adjusted. The controller 342 continues to monitor the processor 300 at step 514 and queries the sensor. If the frequency and voltage values are different from the present values, the processor operating point is adjusted.

The controller 342 outputs the new frequency and voltage settings at step 518. These settings have been picked based on the desired operating point. For one embodiment, the settings are chosen to provide optimal processor efficiency while minimizing processor power dissipation. The frequency offset control bits 436 and range select 434 are toggled in the coupled clock generator 308. At step 520, the new frequency and voltage settings take effect at the coupled clock generator 308 and the power supply 358, respectively. For this embodiment, the core VCC supply voltage 348 for the processor core 354 is adjusted, but the supply voltage to the clock generator block 302 is not changed. The coupled clock generator clock signal 314 is adjusted and is outputted to the processor core 354. The frequency adjustment range of the coupled clock generator 308 comprises of a number of small steps. As a result, the frequency adjustments do not require the VCO 448 to relock with the PLL 306 or the system clock 304. The initial clock adjustment of one embodiment may take effect during synched clock boundaries in the present core clock signal and the newly adjusted clock signal as the signals may be close in frequency and the adjustment is small. However, once the processor core 354 has been switched over to the coupled clock generator clock 314, additional adjustments to the clock frequency can occur. As the frequency of the coupled clock generator clock 314 is adjusted more and moves away from the reference at PLL clock 312, the synchronized clock boundary for adjustments may not exist and the adjustments simply take effect at the coupled clock generator 308. The core 354 to the front-side bus interface also has built-in synchronization. The controller 342 continues to monitor the processor 300 and evaluates the sensors for further changes.

The examples above have been described in the context of a single processor. In a multiprocessor system, the method can be performed concurrently in each processor. Each processor can contain an adaptive variable frequency clock system. For example, each processor can be adjusting its own frequency and voltage settings independent of the other processors in the system. However, the overall system software may have the capability to control all of the processor either through a hardware pin or software inputs.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method comprising:
   switching a source for a core clock from a first clock generator to an adjustable clock generator;
   monitoring operation of core circuitry;
   determining whether to adjust from a present operating point for said core circuitry;
   toggling said adjustable clock generator to a new setting if said determination indicates an operating point adjustment is needed;
   outputting a clock signal having a new frequency from said adjustable clock generator to said core clock;
   syncing said adjustable clock generator to said first clock generator before said switching; and
   enabling control logic to shift an operating point for said core circuitry, wherein said present operating point is shifted by adjusting to a new clock frequency and a new processor supply voltage.

2. The method of claim 1 further comprising toggling a power supply to a new supply voltage if said determination indicates said operating point adjustment is needed.

3. A method comprising:
   switching a source for a core clock from a first clock generator to an adjustable clock generator;

monitoring operation of core circuitry;

determining whether to adjust from a present operating point for said core circuitry;

toggling said adjustable clock generator to a new setting if said determination indicates an operating point adjustment is needed;

outputting a clock signal having a new frequency from said adjustable clock generator to said core clock;

syncing said adjustable clock generator to said first clock generator before said switching;

enabling control logic to shift an operating point for said core circuitry; and selecting a new operating point for said core circuitry, wherein said selecting further comprises generating a set of control bits to indicate a new frequency setting and a new voltage setting.

4. The method of claim 3 wherein said determining further comprises evaluating power dissipation and circuitry efficiency.

5. An apparatus comprising:

clock switching logic coupled to provide one of its inputted clocks as a core clock signal to core circuitry;

a first clock generator coupled to input a first clock signal to said clock switching logic;

an adjustable clock generator coupled to input an adjustable clock signal to said clock switching logic to adjust said frequency without stopping operation of said core circuitry, wherein said adjustable clock generator is a coupled oscillator clock generator comprising:

a digital-to-analog converter coupled to said control logic, said digital-to-analog converter to receive frequency offset settings from said control logic; and a voltage controlled oscillator coupled to said digital-to-analog converter, said voltage control oscillator to generate said adjustable clock signal, control logic coupled to said clock switching logic, said control logic to determine which of said inputted clocks at said clock switching logic is selected for output as said core clock signal and wherein said control logic determines frequency steps and adjustments for said adjustable clock generator.

6. The apparatus of claim 5 wherein said voltage controlled oscillator is coupled to receive a control signal from said first clock generator, said control signal to cause said voltage controlled oscillator to be referenced to said first clock generator.

7. The apparatus of claim 6 further comprising a local feedback loop to maintain said first clock generator in lock with an external system clock.

8. The apparatus of claim 7 wherein said first clock generator is a phased lock loop.

9. The apparatus of claim 8 wherein said apparatus is a processor.

10. The apparatus of claim 8 wherein said apparatus is a system logic chip.

* * * * *